US 6,643,805 B1

(12) United States Patent
Kikutake et al.

(10) Patent No.: US 6,643,805 B1
(45) Date of Patent: Nov. 4, 2003

(54) MEMORY CIRCUIT BEING CAPABLE OF COMPRESSION TEST

(75) Inventors: Akira Kikutake, Kawasaki (JP); Masato Matsumiya, Kawasaki (JP); Satoshi Eto, Kawasaki (JP); Kuninori Kawabata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/568,123

(22) Filed: May 10, 2000

(30) Foreign Application Priority Data

May 31, 1999 (JP) ............................................ 11-153013

(51) Int. Cl.[7] .............................. G11C 29/00; G11C 7/00
(52) U.S. Cl. ........................................ 714/718; 365/201
(58) Field of Search ................................. 714/718, 719, 714/721, 763, 725, 710, 711, 51, 42; 365/189.01, 189.04, 189.05, 201, 220, 230.01

(56) References Cited

U.S. PATENT DOCUMENTS

| 5,506,849 A | * | 4/1996 | Kato ........................... 714/719 |
| 5,673,270 A | * | 9/1997 | Tsujimoto .................... 714/718 |
| 5,936,901 A | * | 8/1999 | Wong et al. ................. 365/201 |

* cited by examiner

*Primary Examiner*—Christine T. Tu
(74) *Attorney, Agent, or Firm*—Arent Fox Kintner Plotkin & Kahn PLLC

(57) ABSTRACT

The present invention is a memory circuit which selects N number of segments out of M number of segments (N<M) during normal reading, wherein all the M number of segments are activated during a read test in order to drive a common data bus for testing by a plurality of sense buffers in the M number of segments. For this, test signals are supplied to a column decoder, and segment select signals, for activating the M number of segments, are generated in response to the test signal. In this way, a plurality of segments in a memory bank in a select status can be simultaneously selected to execute a read test, and the efficiency of a compression read test can be improved.

6 Claims, 15 Drawing Sheets cacdec

MEMORY CIRCUIT BEING CAPABLE OF COMPRESSION TEST

BACKGROUND OF THE INVENTION

1. Field of the Invention

The present invention relates to a memory circuit being capable of a compression test, and more particularly to a memory circuit having a higher degree of compression for the compression test in the memory configuration corresponding to multiple bit inputs/outputs.

2. Description of the Related Art

For memory circuits such as semiconductor memories, the segment configuration and column decoder configuration in a memory bank are designed considering the input/output bit configuration. For example, a memory device has a configuration such that 8-bit read data is output simultaneously and 8-bit write data is input simultaneously. In a case of such a multiple bit input/output configuration, the memory device has a number of common data buses corresponding to the number of inputs/outputs in order to output read data simultaneously and to input write data simultaneously to the plurality of common data bases. As a result, read or write is executed simultaneously from the input/output circuits corresponding to the number of inputs/outputs.

In a test of a memory circuit, a compression read test is executed for a plurality of sense amplifiers selected by a same column select signal, by simultaneously writing a same data (H level or L level) and simultaneously reading the same data. This test is to check whether the basic writing and reading operation to a memory cell is executed normally for a large capacity memory cell, and the time required for the test can be decreased by executing the test for a plurality of sense amplifiers simultaneously.

FIG. 1 is a drawing depicting a conventional compression read test. In FIG. 1, eight segments, SGM 0–7, disposed in a memory bank, are shown. In these eight segments, four segment select signals, cac0z–cac3z, generated by the first stage column decoder cacdec, are supplied to a group of four segments, SGM0–3 and SGM4–7, respectively. The segment select signals, cac0z–cac3z, are supplied to the column decoder C/Dec in the respective segment via the pre-column decoder pcdec of the respective segment. The column decoder C/Dec selects one of the 64 column select signals, CL0–63. And the signals of the four global data bus lines for reading rgdb0x/z–rgdb3x/z, selected by one column select signal, are amplified by the four sense buffers SB in the segment, and read data buses for testing trdb0x/z and trdb3x/z connected to these sense buffers are driven. x in each signal and bus indicates activation at L level, and z indicates activation at H level. Therefore, the read data bus for testing trdb0x/z is comprised of a pair of buses which output reverse phase signals. This is the same for the other read data bus for testing trdb3x/z.

FIG. 2 is a circuit diagram of the first stage column decoder cacdec in a prior art. The first stage column decoder in FIG. 2 has four NAND gates, 51–54, and two inverters, 55 and 56. The two column address signals, ca06z and ca07z, and the bank select signal, cbnk0z, are supplied, the column address signals are set to be reverse phase signals by the inverters 55 and 56 respectively, and combinations of the four column address signals in total are supplied to the NAND gates 51–54. The bank select signal cbnk0z is supplied to the NAND gates 51–54.

In the first stage column decoder, one of the four segment select signals, cac00x–cac03x, becomes activation level (L level) according to the combination of column addresses when the bank select signal cbnk0z is at H level. These segment select signals, cac0x–cac3x, are inverted by the inverter 18 shown in FIG. 1, becomes segment select signals cac0z–cac3z having a reverse phase, and are supplied to the pre-column decoder pcdec of each segment.

In FIG. 1, two segments out of the eight segments are selected and activated when one of the four segment select signals, cac0x–cac3x, is activated (L level). In the example in FIG. 1, the segment select signal cac3z becomes activation level (H level), and two segments, SGM3 and SGM7, are selected and activated (Active). As a result, eight read data in total, that is, read data from four sense buffers SB of the segments SGM3 and SGM7 respectively, are supplied to the eight input/output circuits, and are output from the input/output terminals in parallel via the common data bus lines, which are not illustrated.

Such a configuration is based on the consideration that multiple bits are simultaneously input/output. In other words, two segments in a bank are simultaneously selected for a predetermined column address, and eight read data are simultaneously output to respective sense buffers. And eight read data is simultaneously output from the eight input/output terminals via corresponding eight common data buses and input/output circuits.

The compression read test is executed for the above mentioned column decoder and segments which are structured according to the read mode. The compression read test is a test to judge whether the read data from the plurality of memory cells are all the same or are partially different, and output the result from the test terminal. This makes read judgment easier and decreases the time required for a read test.

For this compression read test, the first common read data bus for testing trdb0x/z is disposed for the first segment group SGM0–SGM3, and the second common read data bus for testing trdb3x/z is disposed for the second segment group SGM4–SGM7. By supplying a predetermined column address just like the above mentioned read operation, one segment in the first and second groups is activated respectively. And outputs from the four sense buffers SB in the segment SGM3, for example, are supplied to the first common read data bus for testing trdb0x/z simultaneously. Outputs from the four sense buffers SB in the segment SGM7, for example, are supplied to the second common read data bus for testing trdb3x/z simultaneously. As a result, a read test can be executed for the eight sense buffers SB simultaneously.

Since in the conventional configuration, multiple bits are input/output, a plurality of common data buses are disposed and a plurality of read data is simultaneously output by a normal read operation. Therefore in the compression read test, data read simultaneously are all processed to match or mismatch signals by the common read data buses for testing trdb0x/z and trdb3x/z, and are output.

However, the simultaneous read test is executed only for eight memory cells, so the compression rate is not very high. Even though one memory bank has eight segments, only two of these eight segments are activated in a selected memory bank, therefore the remaining six segments must be tested at another time by setting the memory banks continuously at a selected status. This makes the efficiency of a compression read test poor.

SUMMARY OF THE INVENTION

With the foregoing in view, it is an object of the present invention to provide a memory circuit which can increase the efficiency of a compression read test.

It is another object of the present invention to provide a memory circuit which can increase the efficiency of a compression read test by enabling an operation which is different from a normal read operation.

To achieve the above objects, an aspect of the present invention is a memory circuit which selects N number of segments out of M number of segments (N<M) during normal reading, wherein all the M number of segments are activated during a read test in order to drive a common data bus for testing by a plurality of sense buffers in the M number of segments. For this, test signals are supplied to a column decoder, and segment select signals, for activating the M number of segments, are generated in response to the test signal. In this way, a plurality of segments in a memory bank in a select status can be simultaneously selected to execute a read test, and the efficiency of a compression read test can be improved.

To achieve the above objects, another aspect of the present invention is a memory circuit comprising: M number of segments (M is an integer) each of which has a plurality of memory cells; and a common data bus for testing arranged for the M number of segments, wherein N number of segments out of the above M number of segments (N is an integer, N<M) are activated during normal reading, and all the above M number of segments are activated during a compression read test in order to drive the common data bus for testing by a plurality of sense buffers in the M number of segments.

According to a preferred embodiment of the present invention, the memory circuit further comprises a column decoder for generating a segment select signal for the above segments by decoding the column address signal, wherein the above column decoder is supplied with a compression test control signal, and generates a segment select signal for simultaneously activating the above M number of segments, regardless the above column address signal, when the compression test control signal is in active status.

Another preferred embodiment of the present invention is a memory circuit wherein the above M number of segments are divided into L groups (L is an integer), the common data bus for testing is commonly disposed for the M/L number of segments of each group, one segment out of the M/L number of segments of each group is selected during the above mentioned normal reading, and the M/L number of segments of each group are simultaneously activated during the compression read test in order to supply data to the above common data bus for testing.

DESCRIPTION OF THE PREFERRED EMBODIMENTS

Embodiments of the present invention will now be described with reference to the accompanying drawings. These embodiments, however, do not restrict the technical scope of the present invention.

Figure 3:
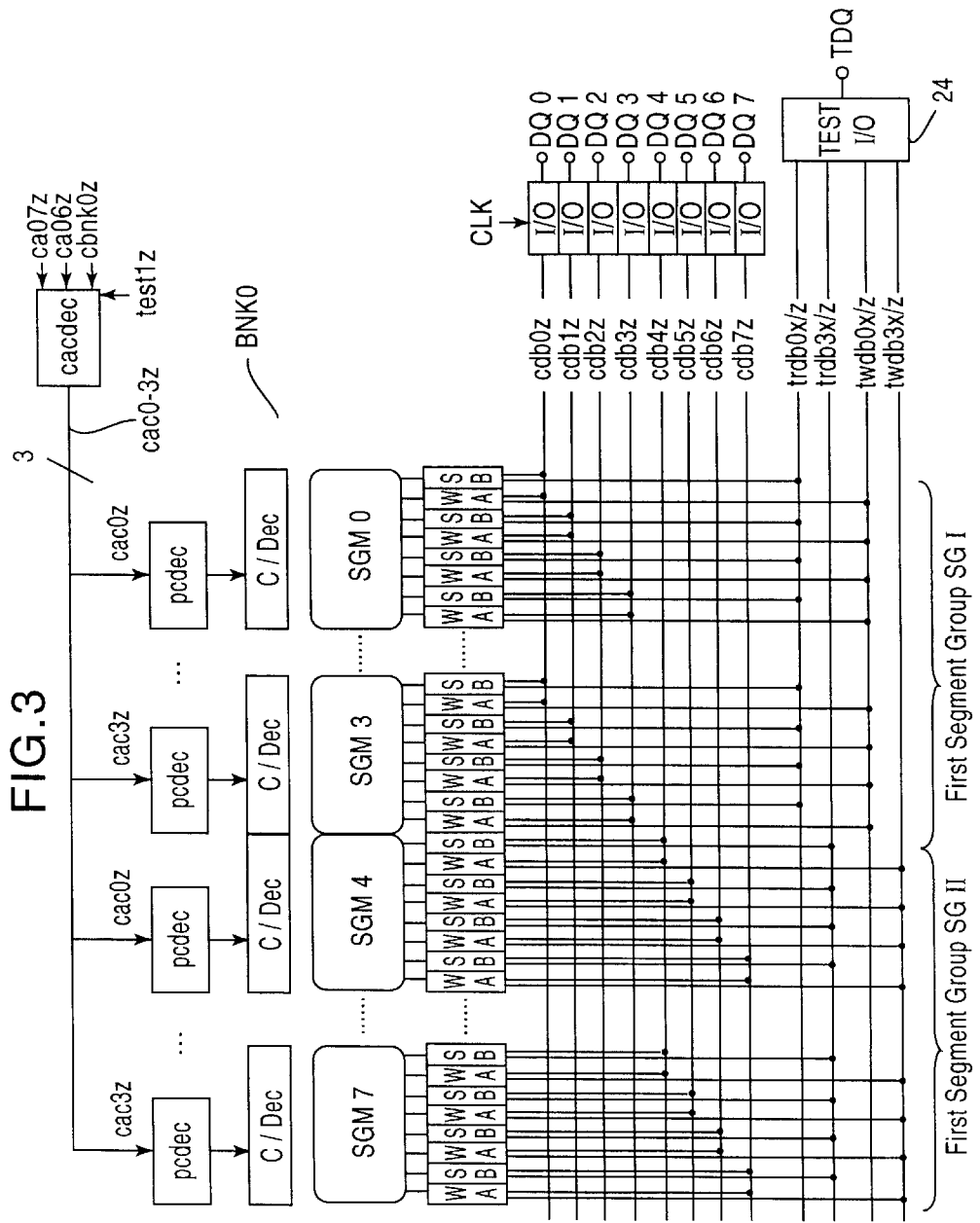
FIG. 3 is a drawing depicting a memory circuit in accordance with the present embodiment.

FIG. 3 is a drawing depicting a memory circuit in accordance with the present embodiment. In FIG. 3, one memory bank BNK0 is shown out of a plurality of memory banks of the memory device. In the memory bank BNK0, eight segments, SGM0–SGM7, are disposed. The eight segments, SGM0–SGM7, are divided into four segments respectively, creating the first segment group SGI comprised of the segments SGM0–SGM3 and the second segment group SGII comprised of the segments SGM4–SGM7. In each segment, four sense buffers SB and four write amplifiers WA are disposed, and during a normal read operation and compression read test, the four sense buffers SB disposed in an activated segment are simultaneously activated.

In the first segment group SGI, four common data buses, cdb0z–cdb3z, in the first group are disposed, and are connected to the four sense buffers SB and four write amplifiers WA in each segment respectively. The common data bus cdb0z is commonly connected to the first sense buffer SB and write amplifier WA of each segment SGM0–SGM3. The common data bus cdb1z is commonly connected to the second sense buffer SB and write amplifier WA of each segment SGM0–SGM3. In the same way, the common data buses cdb2z and cdb3z are also commonly connected to the third and fourth sense buffers and write amplifiers respectively.

In the second segment group SGII as well, four common data buses, cdb4z–cdb7z of the second group, are disposed in the same manner, and the common data bus is commonly connected to the first sense buffer SB and write amplifier WA of each segment.

During an ordinary read operation, the first stage column decoder cacdec decodes the 2-bit column address signals ca06z and ca07z in response to the bank select signal cbnk0z, and sets one of the four segment select signals cac0–3z to the activation level. As a result, one segment, out of the first and second groups SGI and SGII respectively, is activated.

Segments which are selected and activated in each segment group SGI and SGII, four sense buffers SB in the segments SGM0 and SGM4, for example, drive the common data buses cdb0z–cdb3z and cdb4z–cdb7z, of the first group and second group respectively. As a result, 8-bit read data is output to eight common data buses.

The eight common data buses are connected to the eight input/output circuit I/Os respectively, and the 8-bit input/output signal is input/output through the eight input/output terminals DQ0–DQ7 simultaneously. The input/output signal is input/output synchronizing with the internal synchronization clock CLK.

As mentioned above, one segment of each segment group SGI and SGII, out of the eight segments, is activated respectively during a normal write and read operation considering the simultaneous input/output of multiple bits. And each activated segment drives four common data buses respectively, and eight common data buses cdb0z–cdb7 in total are driven. In this way, 8-bit read data can be output simultaneously. 8-bit data can also be written simultaneously.

Now a common compression read test will be explained. In FIG. 3, the read data bus pairs for testing trdb0x/z and trdb3x/z, are connected to the sense buffer SB of the first segment group SGI and the second segment group SGII respectively. In FIG. 3, one of the read data buses for testing is shown, but actually a pair of the read data buses for testing having opposite inverted levels, are disposed, to be described later. Write data bus pairs for testing, twdb0x/z and twdb3x/z, are connected to the write amplifier WA of the first segment group SGI and the second segment group SGII respectively. These write data buses for testing are also disposed as a pair. These data bus pairs for testing are connected to the input/output terminal for testing TDQ via the input/output circuit for testing 24.

According to this embodiment, when the test control signal test1z is in a compression test status, the circuit in the first stage column decoder cacdec makes all the segment select signals cac0z–cac3z are active (selected status, H level), regardless the column addresses ca06z and ca07z. As a result, the four segments in the first segment group and second segment group are all activated simultaneously. Therefore, the four sense buffers SB in each segment simultaneously output read data to the read data bus pair for testing trdb0x/z and trdb3x/z. Write data is supplied to the four write amplifiers WA in each segment from the write data bus pair for testing twdb0x/z and twdb3x/z.

Figure 1:
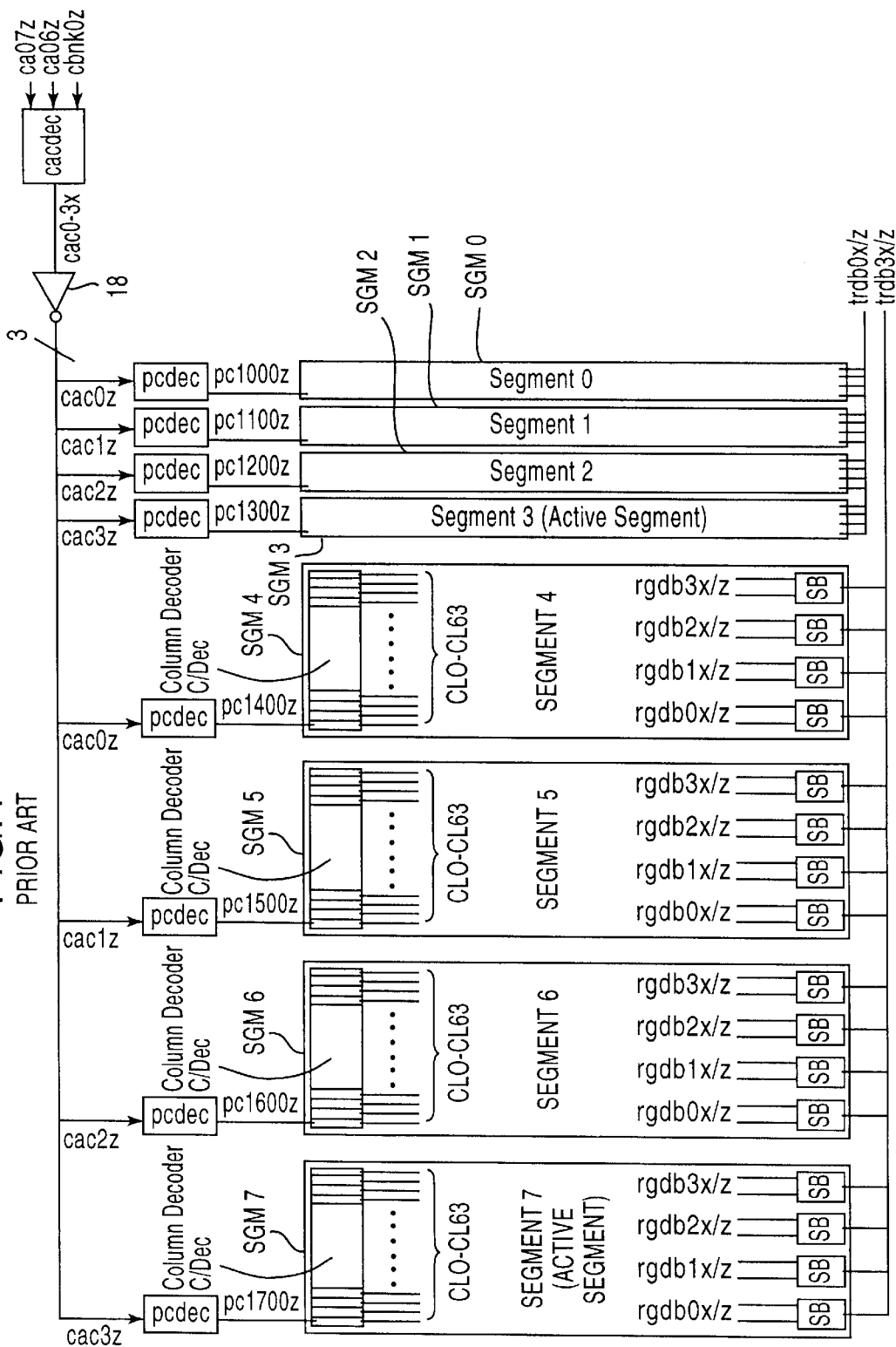
FIG. 1 is a drawing depicting a conventional compression read test.
Figure 4:
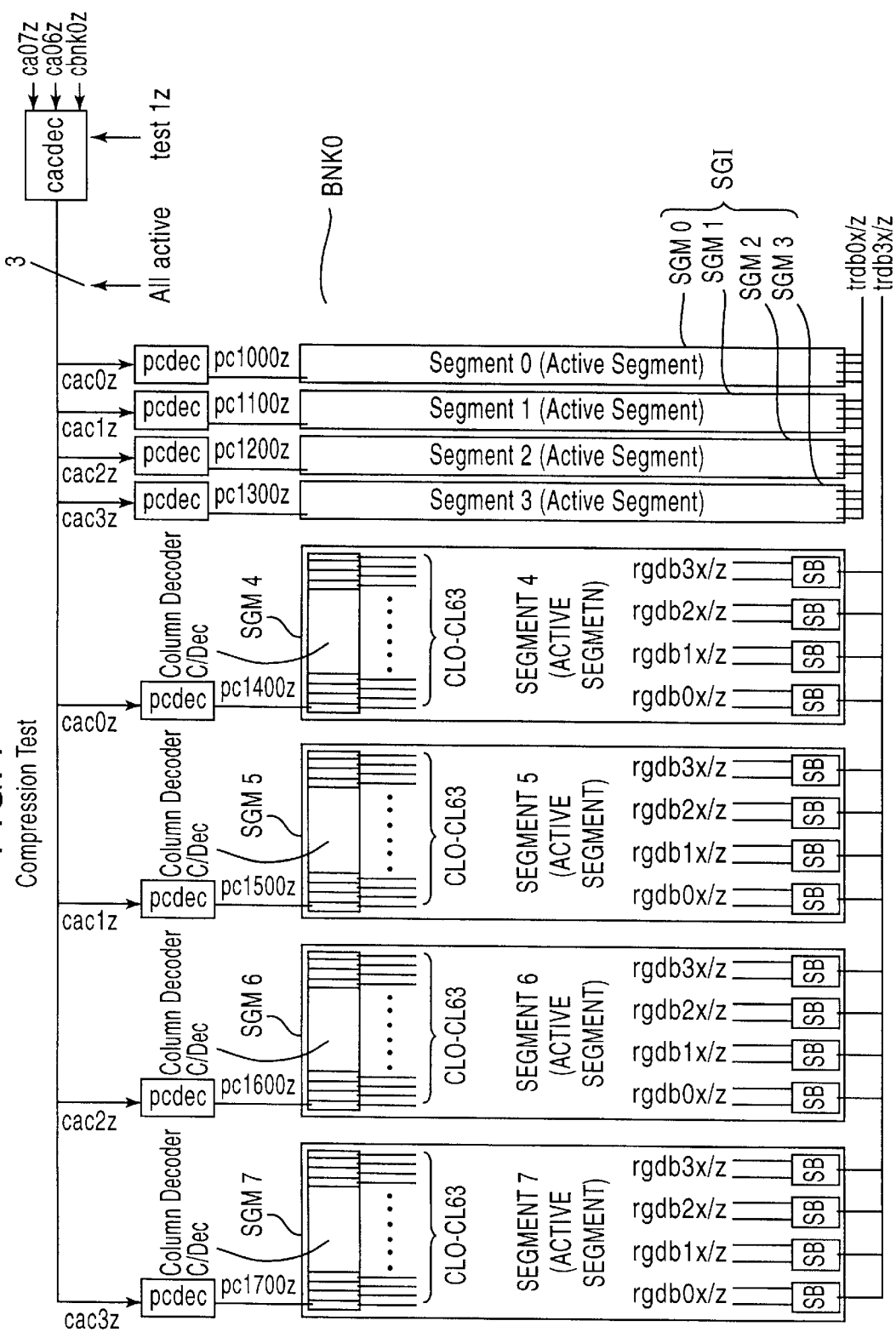
FIG. 4 is a drawing depicting an example of a configuration of a memory circuit for a compression test in accordance with the present embodiment.

FIG. 4 is a drawing depicting an example of a configuration of a memory circuit for a compression test in accordance with the present embodiment corresponding to FIG. 1. As mentioned above, the segment select signals cac0z–cac3z all become the select status during a compression test, so all the segments, SGM0–SGM7, are activated.

Figure 5:
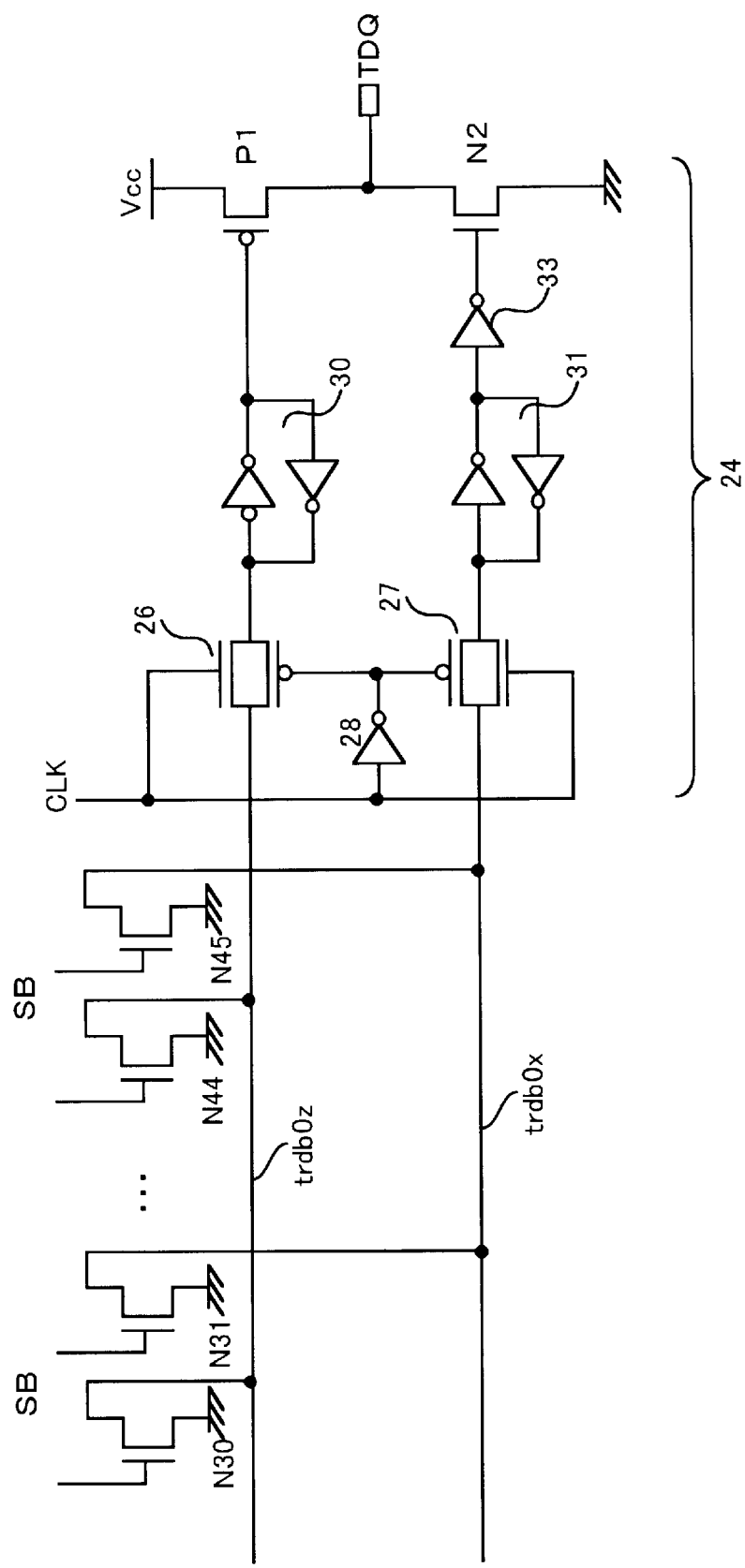
FIG. 5 is a circuit diagram depicting an example of an output part of an input/output circuit for testing.

FIG. 5 is a circuit diagram depicting an example of an output part of an input/output circuit for testing. In the output part of the input/output circuit for testing 24, signals of the read data bus pairs for testing trdb0x and trdb0z are supplied to the final stage transistors comprised of the output transistors P1 and N2 respectively. The read data bus pairs for testing are connected to the transfer gates 26 and 27, which conduct responding to the internal synchronization clock CLK, and the read data is held by the latch circuits 30 and 31 comprised of two inverters respectively. The inverting signal of the read data bus for testing trdb0z is directly supplied to the output transistor P1 at the P channel side, and the inverting signal of the read data bus for testing trdb0x is supplied to the output transistor N2 at the N channel side via the inverter 33.

The plurality of sense buffers SB are connected (wired OR connection) to the common read data buses for testing trdb0z and trdb0x by the output transistors N30–N45 respectively. Therefore, at least one of the plurality of output transistors N30–N45 connected to the same data bus conducts, the read data buses for testing become L level, and become H level only when none of the output transistors are conducted.

Figure 6:
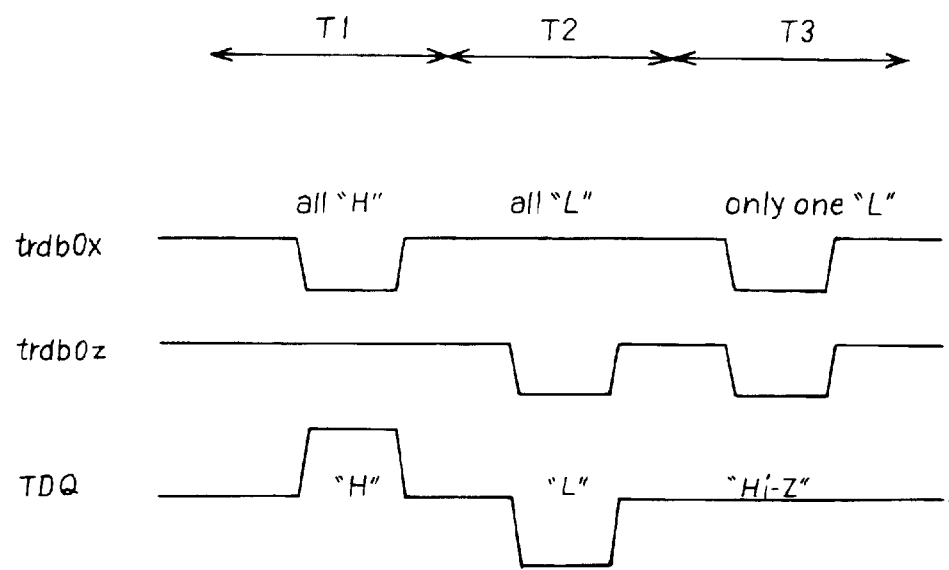
FIG. 6 is a drawing depicting the relationship between read data buses for testing and the level of input/output terminals for testing in a compression read test.

FIG. 6 is a drawing depicting the relationship between the read data buses for testing and the level of input/output terminals for testing in a compression read test. In the example shown in FIG. 6, during a compression read test, all outputs of the sense buffers SB are at H level at time T1 where the read data bus for testing trdb0x at the inverted side is at L level, and the read data bus for testing trdb0z at the non-inverted side is at H level. Therefore, the P channel transistor P1 of the input/output circuit 24 conducts, the N channel transistor N2 does not conduct, and the input/output terminal for testing TDQ becomes H level. As a result, it is detected that all read data is at H level.

At time T2, all outputs of the sense buffers SB are at L level, where the read data bus for testing trdb0x at the inverted side is at H level, and the read data bus trdb0z at the non-inverted side is at L level. Therefore, the N channel transistor N2 of the input/output circuit 24 conducts, the P channel transistor P1 does not conduct, and the input/output terminal for testing TDQ becomes L level. As a result, it is detected that all read data is at L level.

When H level and L level are mixed in the output of the sense amplifiers SB, both of the read data buses for testing trdb0z and trdb0x becomes L level due to the above mentioned wired OR connection. As a result, both of the output transistors P1 and N2 of the input/output circuit 24 become non-conductive, and the input/output terminal for testing TDQ becomes high impedance status. This status can be easily detected by test equipment.

As mentioned above, in a compression read test, eight segments in the memory bank are simultaneously activated, and all sense buffers SB drive the common data bus pair for testing. And three statuses, that is, all read data at H level, all read data at L level or H level and L level mixed in the read data, can be detected. In other words, by executing the above compression read test after writing the same data for test writing, writing and reading of a plurality (4×8=32) of memory cells can be simultaneously executed and test time can be compressed.

Figure 2:
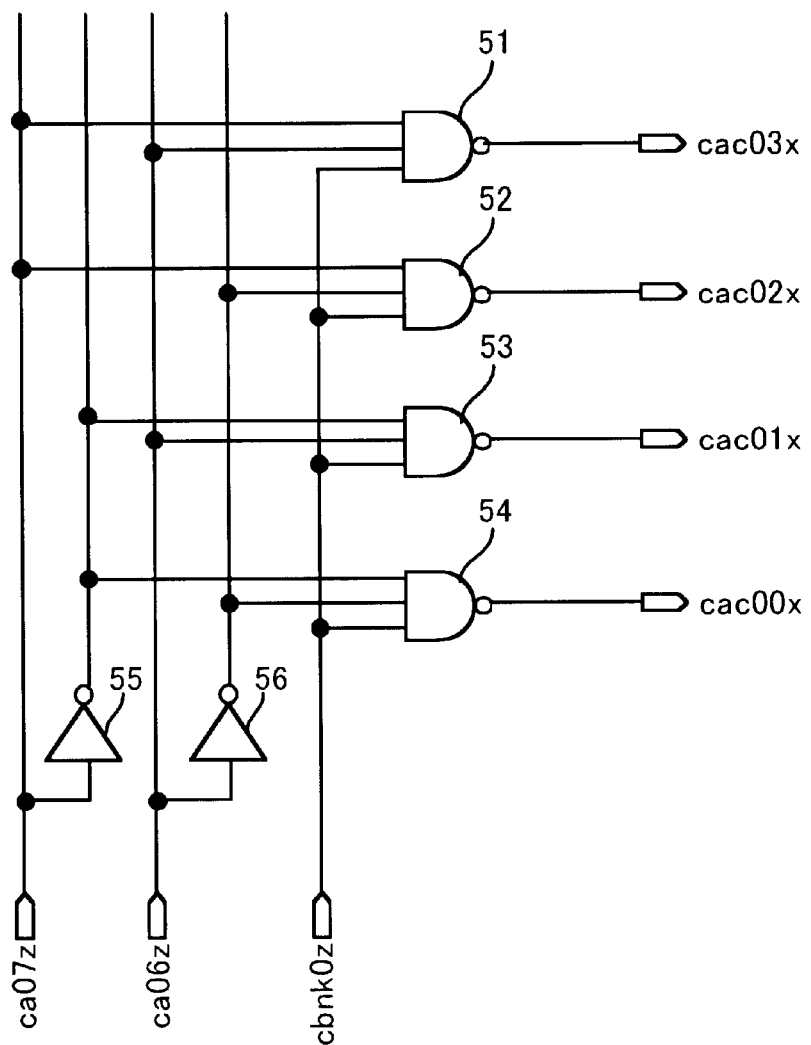
FIG. 2 is a circuit diagram depicting a first stage column decoder of a prior art.
Figure 7:
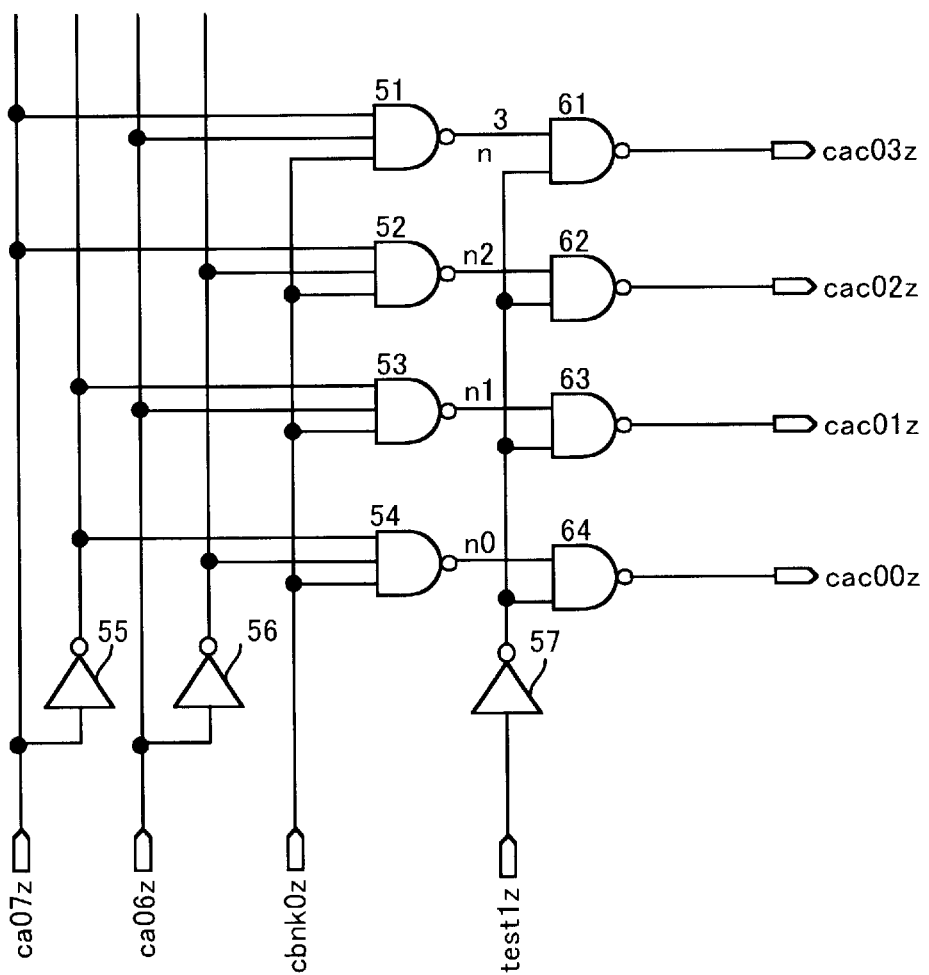
FIG. 7 is a logical circuit diagram of an example of a first stage column decoder in accordance with the present embodiment.

FIG. 7 is a logic circuit diagram of an example of a first stage column decoder cacdec in accordance with the present embodiment. The same parts as the prior art in FIG. 2 are denoted with the same reference numbers. In addition to the bank select signal cbnk0z and column addresses ca07z and ca06z, the compression test control signal test1z is supplied to the first stage column decoder cacdec in FIG. 7. The NAND gates 51–54 generate the activation level (L level), depending on the combination of the column address signals, which is the same as the prior art. In the example in FIG. 7, however, NAND gates 61–64 and the inverter 57 are disposed so that all the segment select signals cac00z–cac03z are forced to be the activation status (H level) by the activation level (H level) of the compression test control signal test1z. In other words, all the segments can be force-selected by integrating the logic of the compression test control signal into the first stage column decoder for selecting a segment.

In such a first stage column decoder, when the compression test control signal text1z is at the non-activation level (L level), one segment select signal out of the four segment select signals cac00z–cac03z become activation status (select status) by normal operation. When the compression test control signal test1z is at the activation level (H level), all four segment select signals cac00z–cac03z become activation status (H level) regardless the column address. As a result, all eight segments are controlled to be activation status.

Figure 8:
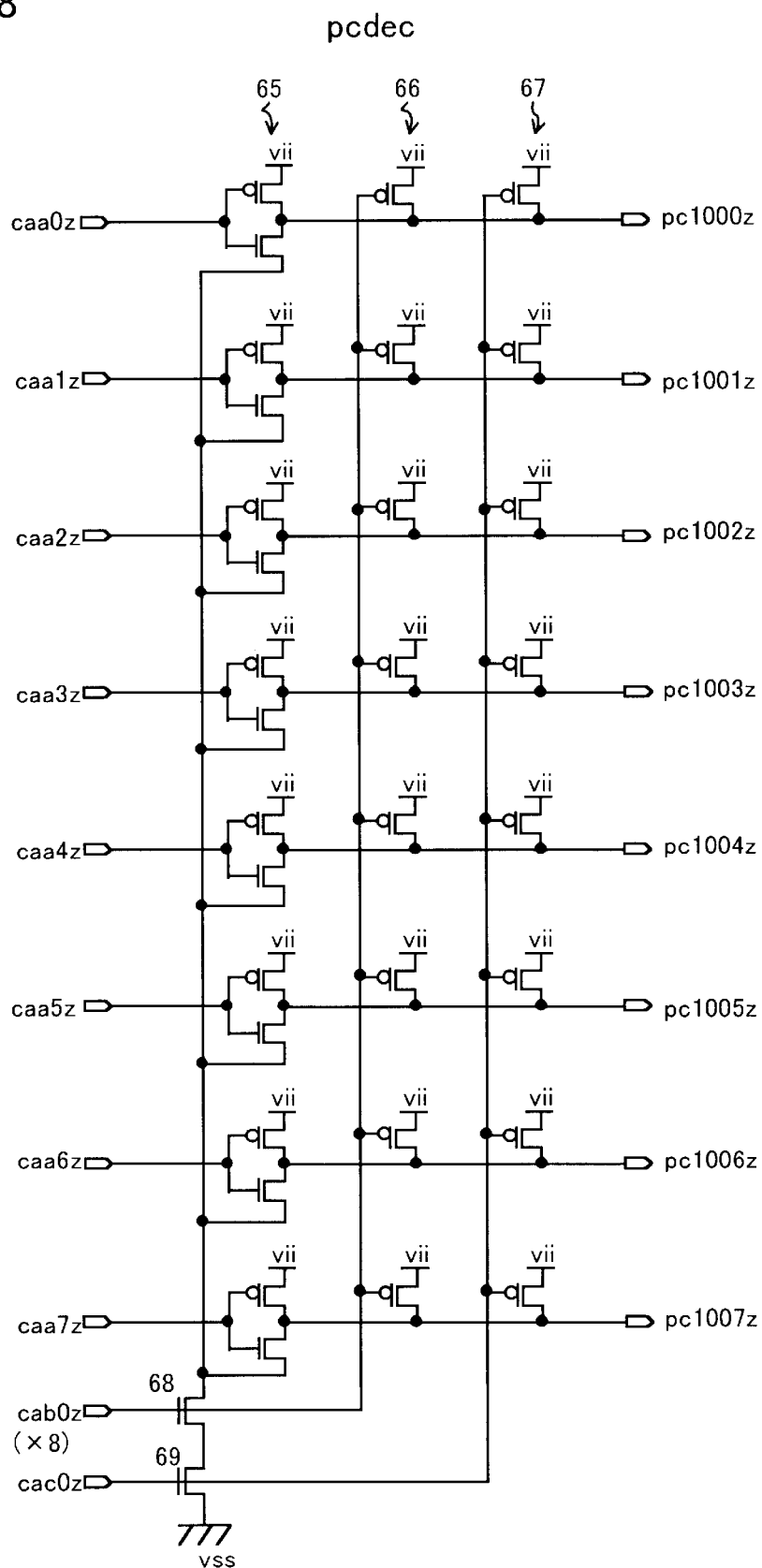
FIG. 8 is a drawing depicting an example of a circuit which is a part of a pre-column decoder in accordance with the present embodiment.

FIG. 8 is a drawing depicting an example of a circuit which is a part of a pre-column decoder pcdec in accordance with the present embodiment. FIG. 8 shows a partial circuit example of a pre-column decoder pcdec corresponding to the segment SGM0 in FIG. 3 and FIG. 4. The segment select signal cac0z, generated by the first stage column decoder cacdec in the c system, eight column select signals caa0z–caa7z, generated by the first stage column decoder in the a system, which is not illustrated, and one column select signal cab0z out of the eight column select signals cab0z–cab7z, generated by the first stage column decoder of the b system, which is also not illustrated, are supplied to this pre-column decoder pcdec.

This pre-column decoder is comprised of N channel transistors 68 and 69, P channel transistors 66 and 67, and CMOS inverter group 65. The pre-column decoder pcdec shown in FIG. 8 is ⅛ of the actual pre-column decoder configuration. The remaining ⅞ of the circuit has the same configuration as FIG. 8, where only the column select signal of the b system is different.

In the decoder in FIG. 8, both of the N channel transistors 68 and 69 conduct, and both of the P channel transistors 66 and 67 become non-conductive when the column select signal cab0z of the b system and the segment select signal cac0z are at activation level (H level). Therefore, the pre-column select signal pc1000z–pc1007z corresponding to the eight column select signals caa0z–caa7z of the a system having the activation level (H level) is driven to L level. In other words, the pre-column select signal pc100nz is decoded to ⅛ by the pre-column decoder shown in FIG. 8, and is decoded to 1/64 by the remaining ⅞ of the pre-column decoder.

The column decoder C/Dec shown in FIG. 4 sets the column select signals CL0–CL63 corresponding to the pre-column select signal pc100nz to activation status (select status), and supplies these signals to the later mentioned column select gate. That is, the column select signals CL0–CL63 are decoded with 1/64 in each segment, one set of bit lines or sense amplifiers is selected out of the 64 sets of bit lines or sense amplifiers, and are connected to the sense buffer SA or write amplifier WA. There are four bit lines or four sense amplifiers in each set. This configuration will be described later.

Figure 9:
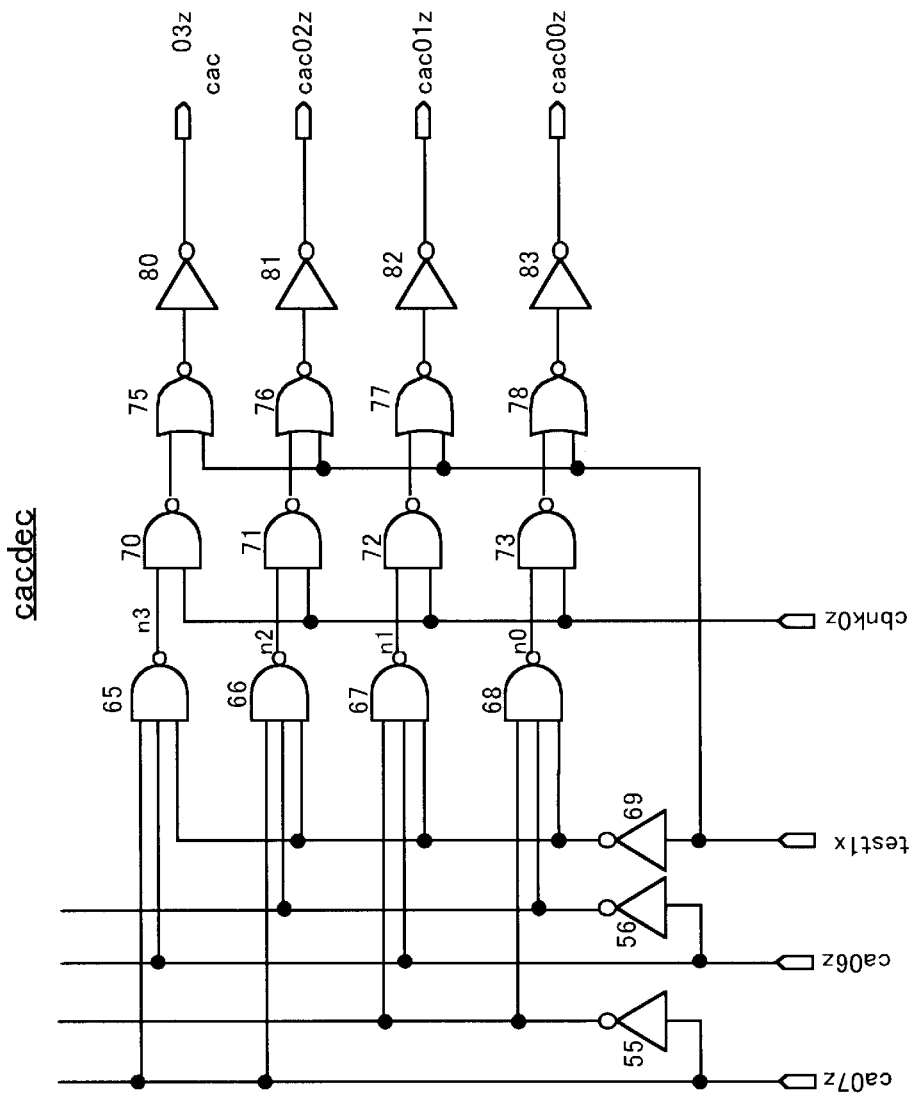
FIG. 9 is a logic circuit diagram depicting another first stage column decoder in accordance with the present embodiment.

FIG. 9 is a logic circuit diagram depicting another first stage column decoder in accordance with the present embodiment. In this circuit, unlike the example in FIG. 7, the column addresses ca06z and ca07z and the compression test control signal text1x are supplied to the NAND gates 65–68. Therefore, during normal operation, the compression test control signal test1x is at L level, and the NAND gates 65–68 decode the column, addresses ca06z and ca07z and output outputs n0–n3. When the bank select signal cbnk0z is at the select status (H level), these outputs n0–n3 are inverted by the NAND gates 70–73, then are inverted again by the NOR gates 75–78 where the compression test control signal text1x is input, and finally are inverted again by the inverters 80–83. As a result, one of the segment select signals cac00z–cac03z becomes the select status (H level). When the bank select signal cbnk0z is in non-select status (L level), all outputs of the NAND gates 70–73 become H level, and all the segment select signals cac00z–cac03z become non-select status, which is L level.

When the compression test control signal test1x becomes test status, which is H level, the outputs of the NOR gates 75–78 are forced to be L level, and all the segment select signals cac00z–cac03z become activation status (select status), which is H level. Therefore, all segments are selected and the number of memory cells which can be simultaneously tested in a compression read test can be increased.

Now the configurations of each segment will be described.

Figure 10:
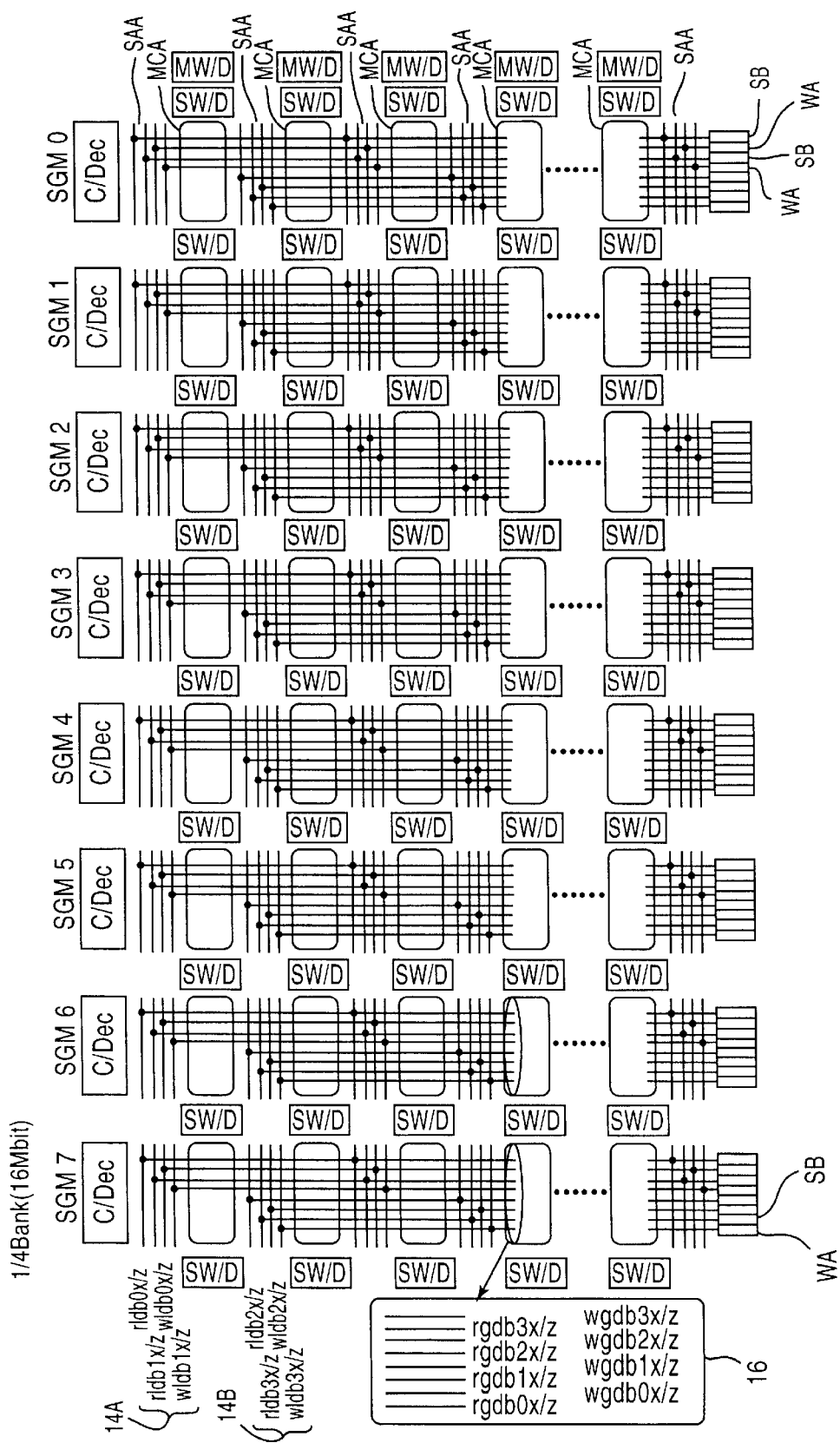
FIG. 10 is a drawing depicting a more detailed configuration of the memory device in accordance with the present embodiment.

FIG. 10 is a drawing depicting a more detailed configuration of the memory device in accordance with the present invention. FIG. 10 in particular shows a detailed configuration of segments having a plurality of memory cells. FIG. 10 shows eight segments, SGM0–7, where a column decoder C/Dec and four sets of sense buffers SB and write amplifiers WA are disposed in each segment.

In the case of the segment SGM0, for example, the memory cell array MCA having a plurality of memory cells and the sense amplifier array SAA are alternately disposed on the segment in the vertical direction (column direction). And the sense amplifier arrays SAA arranged in two, top and bottom rows are disposed on both sides of one memory cell array MCA, and the sense amplifier which amplifies the potential of bit lines in the memory cell array MCA is disposed in the sense amplifier array SAA.

The main word decoder MW/D and the sub-word decoder SW/D are disposed corresponding to the memory cell array MCA. The main word decoder MW/D selects all the sub-word decoders SW/D in the word direction (horizontal direction in FIG. 10) in eight segments, and of the selected sub-word decoders SW/D, the sub-word decoder SW/D belonging to the selected segment drives the word line.

Local data bus for reading rldb#x/z and local data bus for writing wldb#x/z are disposed on the sense amplifier array SAA in FIG. 10 in the word direction (horizontal direction in FIG. 10). The reference character x/z of the data bus denotes a pair of data buses whose signals are reverse phases. Therefore, the local data buses 14A and 14B in the segment have two pairs of local data bus lines for reading respectively. In FIG. 10, the local data buses for reading rldb0x/z and rldb1x/z, and local data buses for writing wldb0x/z and wldl1x/z are disposed on the sense amplifier arrays SAA at odd numbers from the top. The local data buses for reading rldb2x/z and rldb3x/z, and local data buses for writing wldb2x/z and wldb3x/z are disposed on the sense amplifier arrays SAA at even numbers. Therefore, the local data buses in a segment are comprised of four pairs of local data buses for reading and four pairs of local data buses for writing.

Global data buses for reading rgdb#x/z (rgdb0x/z–rgdb3x/z (# indicates a numeric, and is the same hereafter)), and global data buses for writing wgdb#x/z (wgdb0x/z–wgdb3x/z) are disposed on the memory cell array MCA and sense amplifier array SAA of a segment in the bit direction (vertical direction in FIG. 10). In other words, the global data buses 16 are comprised of four pairs of global data buses for reading and writing respectively.

These global data buses, rgdb#x/z and wgdb#x/z, are connected to buses corresponding to a plurality of local data buses rldb#x/z and wldb#x/z disposed in respective segments. In a segment, four global data buses for reading rgdb0x/z–rgdb3x/z are connected to four sense buffers SB belonging to the segment. Also in a segment, four global data buses for writing wgdb0x/z–wgdb3x/z are connected to four write amplifiers WA belonging to the segment.

These sense buffers SB are connected to the common data bus and common read data bus for testing, as shown in FIG. 3, and the write amplifiers WA are also connected to the common write data bus for testing.

Figure 11:
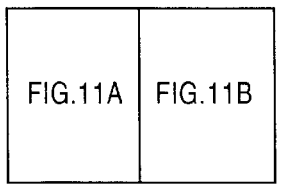
FIG. 11 is a drawing depicting one memory cell array in a segment and sense amplifier arrays on both sides thereof.
Figure 11A:
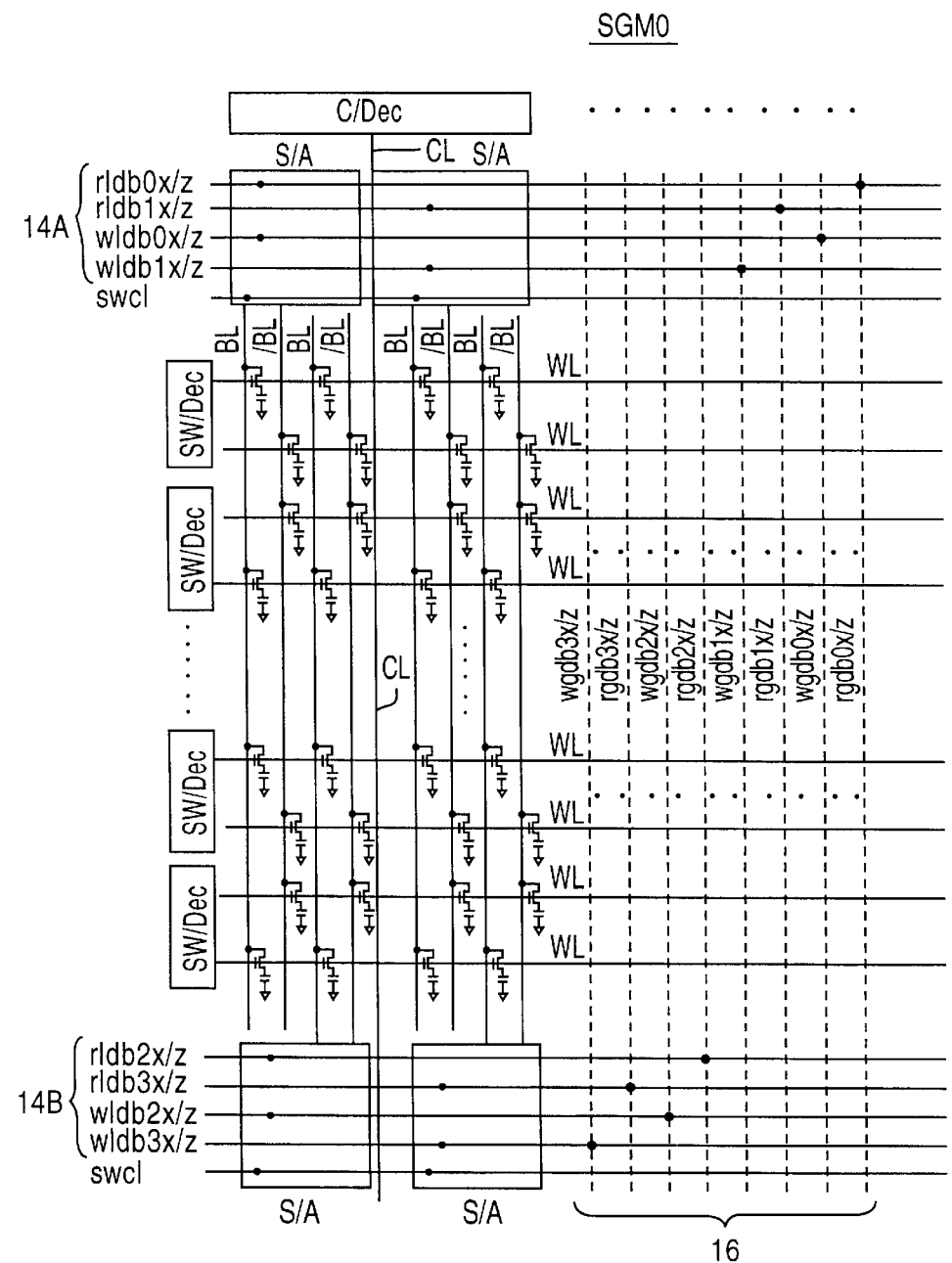
Figure 11B:
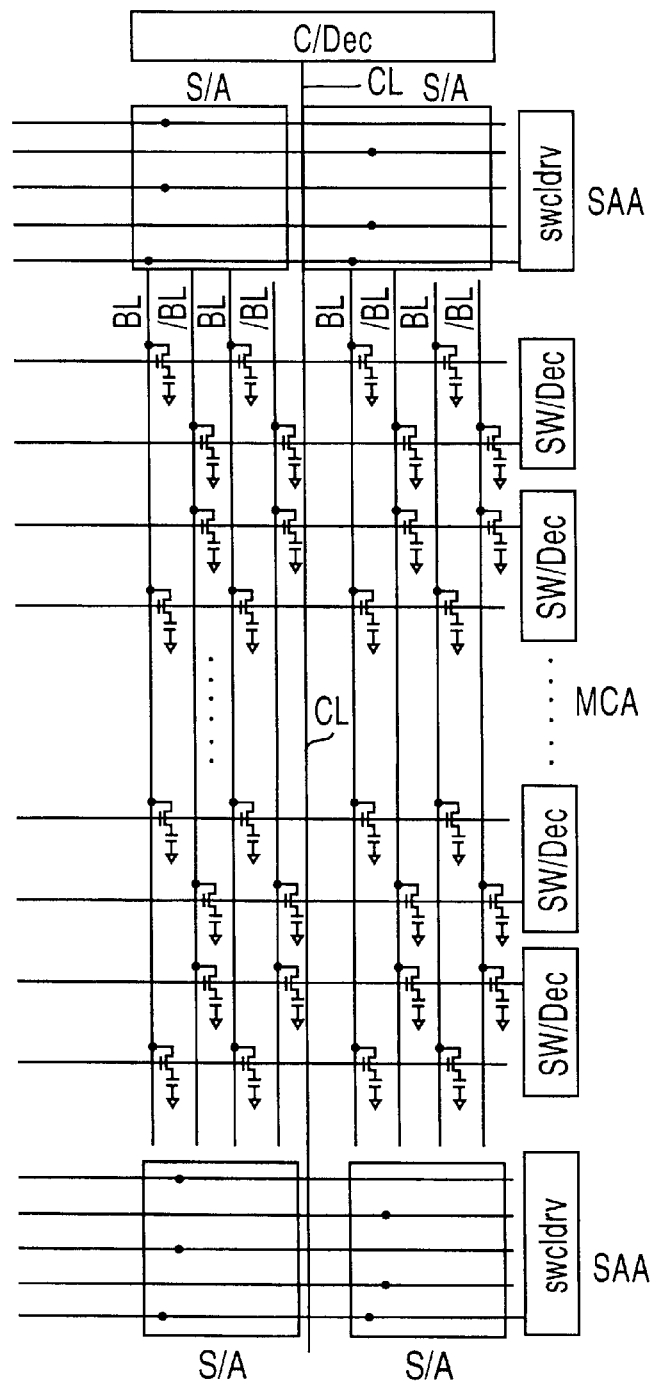

FIG. 11 is a drawing depicting one memory cell array in a segment and sense amplifier arrays on both sides thereof. A plurality of word lines WL which are driven by the sub-word decoder SW/Dec, and a plurality of bit line pairs BL, /BL connected to the sense amplifier S/A respectively are disposed in the memory cell array MCA, and a memory cell comprised of one transistor and one capacitor is disposed at the crossing positions thereof.

The column decoder C/Dec, disposed on a segment, generates the column select signal CL respectively. The outputs of the four sets of sense amplifiers S/A, which are disposed as two sets each in the column direction, are connected to four sets of the local data buses for reading r1db0x/z–r1db3x/z via the column gate, which is not illustrated, and is conducted by the column select signal CL. Four sets of local data buses for writing w1db0x/z–w1db3x/z are connected to the four sets of sense amplifiers S/A which are disposed as two sets each in the column direction via the column gate, which is conducted by the column select signal CL and the column select signal for writing swc1. This column select signal for writing swc1 is driven by the column select signal driver for writing swc1drv.

In FIG. 11, the above mentioned four sets of sense amplifier S/A are positioned at the left end, and the four sets of sense amplifiers S/A are positioned at the right end.

In FIG. 11, the local data bus group 14A is disposed on or near the sense amplifier array SAA at the top of the memory cell array MCA, and the local data bus group 14B is disposed on or near the sense amplifier array SAA at the bottom of the memory cell array MCA. The local data bus group 14A has two pairs of local data buses for reading r1db0x/z and r1db1x/z, and two pairs of local data buses for writing w1db0x/z and w1db1x/z. The local data bus group 14B at the bottom also has two pairs of local data buses for reading r1db2x/z and r1db3x/z and two pairs of local data buses for writing w1db2x/z and w1db3x/z. The column select signal for writing swc1 is disposed along the respective local data bus groups 14A and 14B.

The four pairs of local data buses for reading r1db#x/z and the four pairs of local data buses for writing w1db#x/z disposed in the word direction (horizontal direction) are connected to the four pairs of global data buses for reading rgdb#x/z and four pairs of global data buses for writing wgdb#x/z respectively. And this global data bus group 16 is connected to the sense buffer SB and write amplifier WA belong to the segment, as mentioned above.

Figure 12:
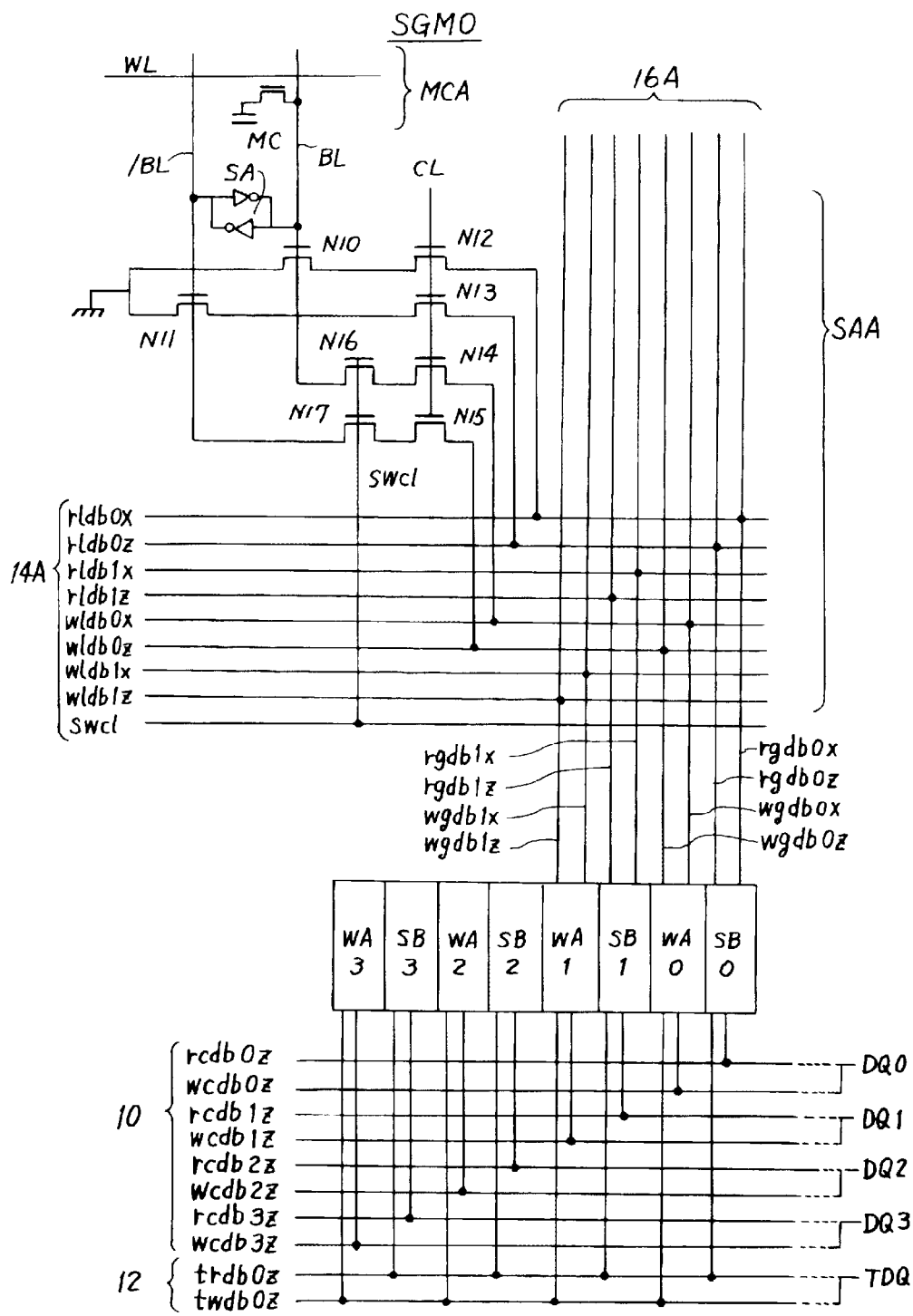
FIG. 12 is a drawing depicting a structure of a local data bus and global data bus in a segment.

FIG. 12 is a drawing depicting a structure of the local data bus and the global data bus in a segment. FIG. 12 shows the configuration from the memory cell MC to the bit line pair BL and /BL, column gate, local data bus group 14A, global data bus group 16A, sense buffer SB, write amplifier WA, and common data bus group 10. In the example in FIG. 12, the common data bus group 10 comprises the common data buses for reading only rcdb0z–rcdb3z and the common data bus for writing only wcdb0z–wcdb3z, which are connected to the sense buffer SB and the write amplifier WA respectively.

A memory cell MC is disposed in the memory cell array MCA at a crossing position between the word line WL and the bit line BL. The sense amplifier SA, connected to the bit line pair BL and /BL, the column gate comprised of the transistors N10–N17, and the local data bus group 14 are disposed in the sense amplifier array SAA.

The transistors N10–N13 constitute a column gate for reading, and the transistors N14–N17 constitute a column gate for writing. For reading, the transistors N12 and N13 are conducted by the column select signal CL at H level, which is supplied by the column decoder C/Dec. At this time, one of the transistors, N10 or N11, is conducted by the sense amplifier SA according to the bit line pair BL and /BL driven to H level and L level, and one of the local data buses for reading r1db0x and r1db0z is driven to H level and the other local is driven to L level.

At this time, transistors N14 and N15 are conducted by the column select signal CL, however the transistors N16 and N17 are not conducted, since the column select signal for writing swc1 is at L level, therefore the bit line pair BL and /BL is not connected to the local data bus for writing w1db0x and w1db0z. Therefore the local data buses for writing w1db0x and w1db0z are maintained at the precharge level, for example.

The local data buses for reading r1db0x and r1db0z are also connected to the global data buses for reading rgdb0x and rgdbd0z, and the read data is supplied to the sense buffer SB0 via the global data bus rgdb0x and rgdb0z. The sense buffer SB senses the voltage of the global data buses rgdb0x and rgdb0z for reading, and supplies the output to the common data bus for reading rcdb0z.The common data bus for reading rcdb0z is transferred to the data input/output terminal DQ0 via the output circuit, which is not illustrated, and is output.

When the write data is supplied to the data input/output terminal DQ0 in a write operation, on the other hand, the write data is supplied to the write amplifier WA0 via the common data bus for writing wcdb0z. According to this write data, the write amplifier WA0 drives the global data bus line pair for writing wgdb0x/z to H level and L level. At the same time, the local data bus line pair for writing w1db0x/z connected to the global data bus line pair wgdb0x/z is also driven to H level and L level.

In a write operation, when the column select signal CL becomes H level, the column select signal for writing swc1 also becomes H level, and the local data bus line pair for writing w1db0x/z is connected to the bit line pair BL and /BL via the transistors N14–N17. As a result, the write amplifier WA0 drives the bit line pair via the global data bus line pair and local data bus line pair.

As FIG. 12 shows, the local data bus line pair for reading and the local data bus line pair for writing are electrically separated by the transistors N10 and N11. Therefore, it is unnecessary to drive the local bus and the global data bus for reading, in addition to the local data bus and the global data bus for writing, by the write amplifier WA.

As FIG. 12 clearly shows, in the present embodiment, the part between the sense amplifiers SA and the data input/output terminals DQ is completely separated into a data bus for reading and a data bus for writing. Therefore, even if read data remains on the common data bus, for example, immediately after the valid read data of the memory cell is output from the data input/output terminals DQ via the sense amplifier, column gate, local data bus, global data bus, and common data bus during a read operation, write data can be supplied to the bit line pair via the common data bus for writing, global data bus for writing, and local data bus for writing, which are alternate routes for writing, without precharging them.

FIG. 12 shows only two pairs of global data buses 16A (rgdb#x/z and wgdb#x/z) and local data buses 14A (rldg#x/z and rldb#x/z) for reading and writing respectively. The other half of the global buses and local data buses having the same configuration, and the global data buses are connected to the sense buffers SB2 and 3, and the write amplifiers WA 2 and 3 respectively. In FIG. 12, the input/output terminals for testing TDQ are connected to the read and write data buses for testing trdb0z and twdb0z via the respective input/output circuits, which are not illustrated.

Figure 13:
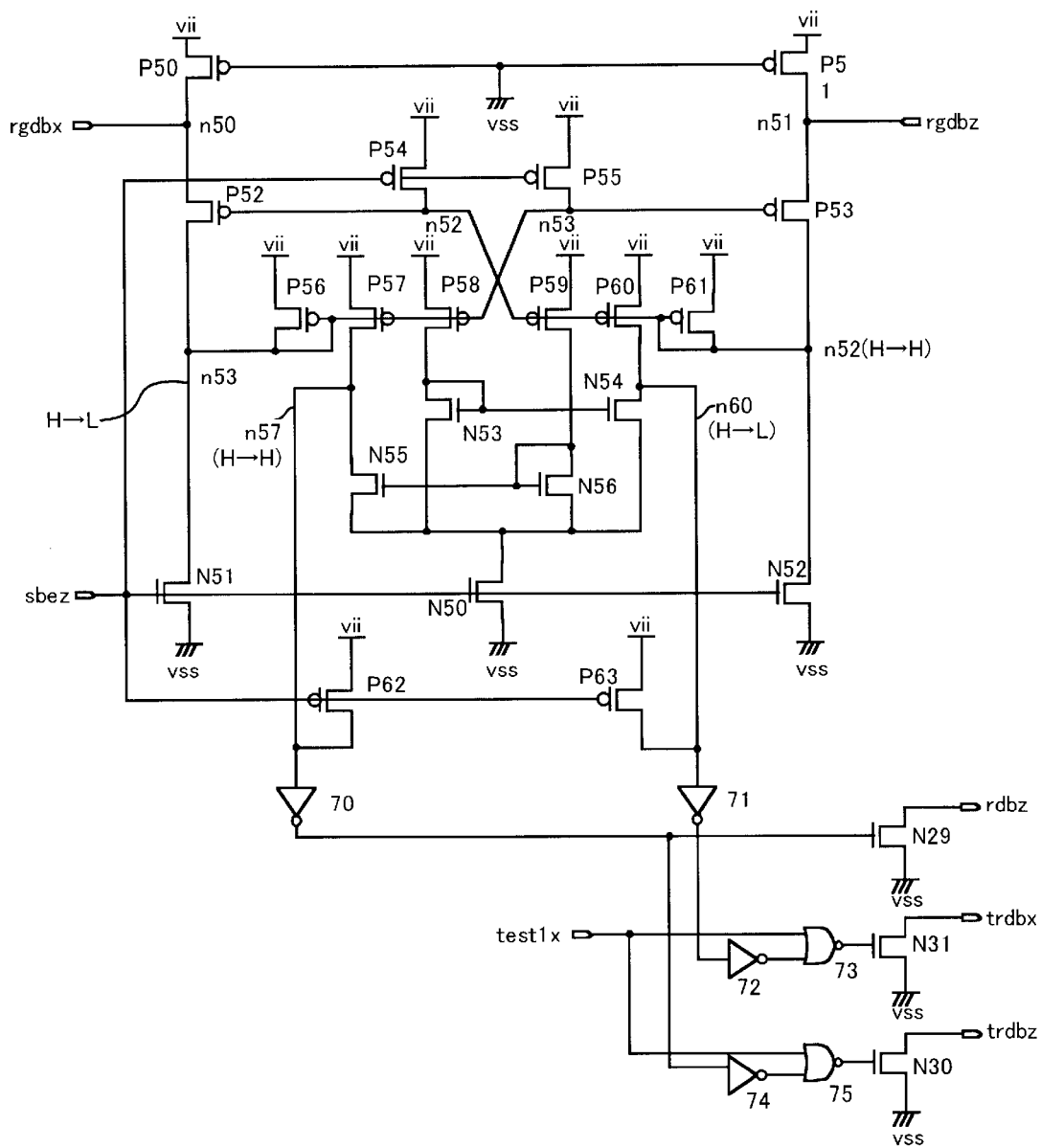
FIG. 13 is a circuit diagram depicting an example of a sense buffer circuit.

FIG. 13 is a circuit diagram depicting an example of a sense buffer circuit. This sense buffer circuit detects and amplifies the reverse phase signal of the global data bus for reading rgdbx/z during normal operation, generates a detection signal to the node n57, and drives the common data bus for reading rdbz via the inverter 70 and output transistor N29. During a compression test, this sense buffer circuit supplies the detection signals of the node n57 and n60 to the output transistors N30 and N31 via the inverters 70, 71, 72 and 74 and the NOR gates 73 and 75 responding to the compress ion test control signal test1x, and drives the read data bus line pair for testing trdbx/z by the transistors.

In the sense buffer circuit, the P channel transistors P50 and P51 comprise a load circuit which is always conducted, and supplies current to the nodes n50 and n51. When the sense buffer enable signal sbez is in non-activation status (L level), both the P channel transistors P54 and P55 conduct and both the nodes n52 and n53 are reset to H level. In the same way, the P channel transistors P62 and P63 conduct, and nodes n57 and n60 are reset to H level.

Then, when the sense buffer enable signal sbez becomes active status (H level), the N channel transistors N50, N51 and N52 conduct, and the above mentioned P channel transistors P54, P55, P62 and P63 become non-conductive status. By the transistors N51 and N52 conducting, both the nodes n52 and n53 are pulled to the ground side, where potential decreases, and are conducted by a drop of the gates of the transistors P52 and P53.

Assume that the global data bus for reading rgdbx is at L level and the other global data bus for reading rgdbz is at H level. Here the potential of the node n50 drops, the voltage between the gate and source of the transistor P52 no longer becomes the threshold voltage, and the transistor P52 does not conduct. The potential of the node n51, on the other hand, does not drop, the voltage between the gate and source of the transistor P53 becomes the threshold voltage or higher, and the transistor P53 conducts. This is a "differential operation" executed by the transistors P52 and P53.

Along with the above differential operation, the node n52 continues being pulled up to H level and the node n53 pulled down to L level. The node n52 is connected to the gates of the transistors P59, P60 and P61, and the node n53 is connected to the gates of the transistors P56, P57 and P58, so the reverse phase operation of the nodes n52 and n53 is further amplified by the differential amplifier circuits of the transistors P57 and P58 and transistors P59 and P60, whose sources are connected to the common internal power supply Vii. The transistors N53 and N54 constitute a current mirror circuit for the transistors P58 and P60, and the transistors N55 and N56 constitute a current mirror circuit for the transistors P57 and P59. In other words, two sets of differential circuits are disposed.

Signals amplified by these differential circuits are output to the node n57 (H level) and n60 (L level), and are supplied to the respective inverters 70 and 71. During a normal read operation, the output transistor N29 is maintained to be non-conductive by the L level output from the inverter 70, and the common data bus for reading rdbz is maintained at the pre-charge level, which is H level. When the signal of the global data bus line is reversed, the output transistor N29 is conducted, and the common data bus for reading rdbz is driven from H level, which is the pre-charge level, to L level.

During a compression reading, the output transistors N30 and N31 are driven by the inverted signals of the output of the inverters 70 and 71, one of the read data buses for testing trdbx/z is driven from H level, which is the pre-charge level, to L level, and the other is maintained at H level. The rest of the circuit configuration is as shown in FIG. 5.

Figure 14:
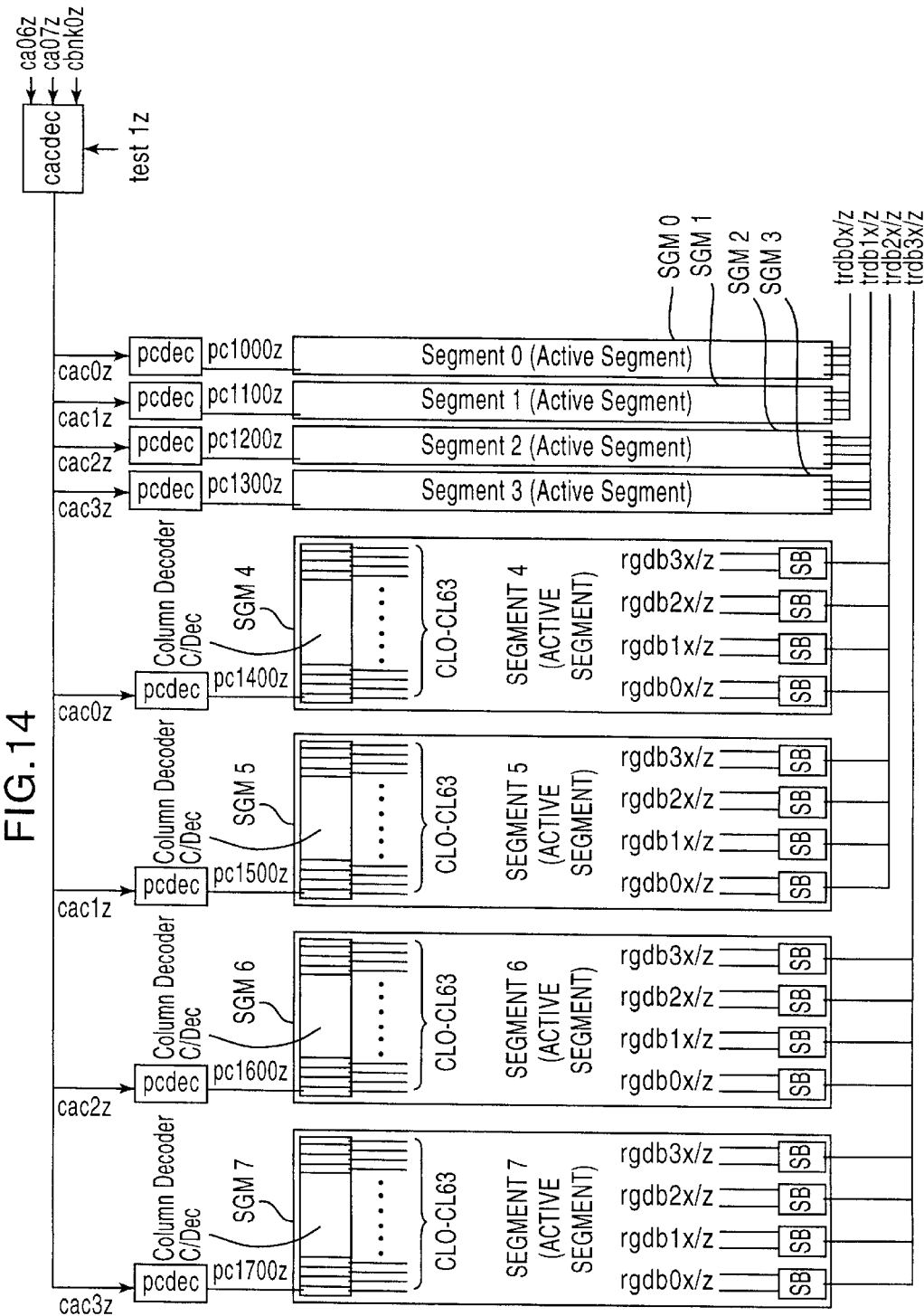
FIG. 14 is a drawing depicting a memory circuit in accordance with another embodiment.

FIG. 14 is a drawing depicting a memory circuit in accordance with another embodiment. The memory circuit is the same as the one shown in FIG. 4, except for the configuration of the read data bus for testing, and the same parts are denoted with the same reference numbers. In the example of FIG. 14, there are four pairs of read data bus line pairs for testing, that is, trdb0x/z, trdb1x/z, trdb2x/z and trdb3x/z, and respective read data bus line pairs for testing are connected to the sense buffers SB of two segments. In this case as well, just like the case of FIG. 4, all segments SGM0–SGM7 are activated by setting all four segment select signals to select status by the compression test control signal text1z at the first stage column decoder cacdec, so that a compression read test can be executed more efficiently. The circuit configuration of the first stage column decoder cacdec is the same as the configuration of the circuit shown in FIG. 7 and FIG. 9.

In the above embodiments, it was explained that outputs from more sense buffers can be simultaneously checked via the read data buses for testing. In the same way, data for testing can be simultaneously written through more write amplifiers WA via the write data buses for testing using the same first stage column decoder.

According to the present invention, compression test efficiency can be improved in a memory circuit configuration which is optimized for reading.

The scope of the present invention is not restricted by the above embodiments, but includes the invention stated in Claims and their equivalents.

What is claimed is:

1. A memory circuit comprising:

M number of segments (M is an integer) each of which has a plurality of memory cells, and a common data bus for testing disposed commonly for said M number of segments, wherein N number of segments out of said M number of segments (N is an integer, and N<M) are activated during normal reading, and all of said M number of segments are activated during a compression read test in order to drive said common data bus for testing by a plurality of sense buffers in said M number of segments.

2. The memory circuit according to claim 1, further comprising a column decoder for generating a segment select signal for said segments by decoding the column address signal, wherein said column decoder is supplied with a compression test control signal, and generates a segment select signal for simultaneously activating said M number of segments, regardless said column address signal, when said compression test control signal is in active status.

3. The memory circuit according to claim 1, wherein said M number of segments are divided in L groups (L is an integer), said common data bus for testing is commonly disposed for M/L number of segments of each group, one segment out of the M/L number of segments of each group is selected during said normal reading, and the M/L number of segments of each group are simultaneously activated during said compression read test in order to supply data to said common data bus for testing.

4. The memory circuit according to claim 1, further comprising:

a plurality of read data buses connected to the plurality of sense buffers of the segment respectively, each read data bus being commonly provided for the plurality of segments, wherein when N number of segments are activated during the normal reading, the sense buffers of the activated segments drive the corresponding different read data buses respectively.

5. The memory circuit according to claim 4, further comprising:

a plurality of write amplifier, provided each segment, for writing write data to the memory cell; and a plurality of write data buses connected to the plurality of the write buffers of the segment respectively, each write data bus being commonly provided for the plurality of segments, wherein the write data is transmitted to the write amplifiers through the write data buses respectively.

6. The memory circuit according to claim 1, wherein:

said common data bus for testing includes a common reads data bus for testing and a common write data bus for testing, each of which is connected to the sense buffer and the write amplifier.

* * * * *